(12) United States Patent
Nakashiba et al.

(10) Patent No.: US 12,740,429 B2
(45) Date of Patent: Sep. 15, 2026

(54) SEMICONDUCTOR DEVICE

(71) Applicant: RENESAS ELECTRONICS CORPORATION, Tokyo (JP)

(72) Inventors: Yasutaka Nakashiba, Tokyo (JP); Hiroshi Miyaki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 617 days.

(21) Appl. No.: 18/181,274

(22) Filed: Mar. 9, 2023

(65) Prior Publication Data

US 2023/0369253 A1 Nov. 16, 2023

(30) Foreign Application Priority Data

May 10, 2022 (JP) ................................ 2022-077552

(51) Int. Cl.
*H10W 44/00* (2026.01)
*H10W 70/05* (2026.01)
(Continued)

(52) U.S. Cl.
CPC ......... *H10W 44/501* (2026.01); *H10W 70/05* (2026.01); *H10W 70/09* (2026.01);
(Continued)

(58) Field of Classification Search
CPC ............... H01L 23/645; H01L 23/3121; H01L 23/5383; H01L 23/5386; H01L 23/5389;
(Continued)

(56) References Cited

U.S. PATENT DOCUMENTS 11,114,377 B2 9/2021 Tanaka
11,139,240 B2 10/2021 Kuwabara et al.
(Continued)

FOREIGN PATENT DOCUMENTS

JP H04-237106 A 8/1992
JP 2019-110237 A 7/2019
JP 2020-123599 A 8/2020

OTHER PUBLICATIONS

Office Action dated Jun. 10, 2025, issued in corresponding Japan Application No. 2022-077552, 6 pages.

*Primary Examiner* — Marlon T Fletcher
*Assistant Examiner* — Christina A Sylvia
(74) *Attorney, Agent, or Firm* — RIMON P.C.

(57) ABSTRACT

A semiconductor device includes a first semiconductor chip, a second semiconductor chip, and a redistribution layer. The first semiconductor chip and the second semiconductor chip are arranged spaced apart from each other in a second direction orthogonal to a first direction. The redistribution layer is disposed across over the first semiconductor chip and the second semiconductor chip. The redistribution layer includes a first inductor and a second inductor. The first inductor and the second inductor are spaced apart and face each other in a third direction orthogonal to the first direction and the second direction. The first inductor and the second inductor are electrically connected to the first semiconductor chip and the second semiconductor chip, respectively. The first inductor and the second inductor are wound across over the first semiconductor chip and the second semiconductor chip in a plane orthogonal to the third direction.

10 Claims, 17 Drawing Sheets

(51) Int. Cl.
*H10W 70/09* (2026.01)
*H10W 70/60* (2026.01)
*H10W 70/65* (2026.01)
*H10W 70/685* (2026.01)
*H10W 74/01* (2026.01)
*H10W 74/10* (2026.01)
*H10W 70/652* (2026.01)

(52) U.S. Cl.
CPC ........ *H10W 70/093* (2026.01); *H10W 70/611* (2026.01); *H10W 70/65* (2026.01); *H10W 70/685* (2026.01); *H10W 74/016* (2026.01); *H10W 74/019* (2026.01); *H10W 74/114* (2026.01); *H10W 70/6528* (2026.01)

(58) Field of Classification Search
CPC ............. H01L 21/4853; H01L 21/4857; H01L 21/565; H01L 21/568; H01L 24/19; H01L 24/20; H01L 24/24; H01L 2224/214; H01L 2924/19042; H01L 2924/19103; H01L 25/0655; H01F 17/0013; H01F 2017/004; H10W 44/501; H10W 70/05; H10W 70/09; H10W 70/093; H10W 70/611; H10W 70/65; H10W 70/685; H10W 74/016; H10W 74/019; H10W 74/114; H10W 70/6528; H10W 70/60; H10W 70/614; H10W 90/00; H10W 90/293
See application file for complete search history.

(56) References Cited

U.S. PATENT DOCUMENTS

2019/0200454 A1* 6/2019 Liu ..................... H01L 23/5227
2020/0243443 A1* 7/2020 Kuwabara ........... H01L 23/5227

* cited by examiner

SEMICONDUCTOR DEVICE

CROSS-REFERENCE TO RELATED APPLICATIONS

The disclosure of Japanese Patent Application No. 2022-077552 filed on May 10, 2022, including the specification, drawings and abstract is incorporated herein by reference in its entirety.

BACKGROUND

The present disclosure relates to a semiconductor device.

There are disclosed techniques listed below.

[Patent Document 1] Japanese Unexamined Patent Application Publication No. 2020-123599

A semiconductor device described in Patent Document 1 includes a first semiconductor chip and a second semiconductor chip, and a redistribution layer. A thickness direction of the semiconductor device is defined as a first direction. A direction orthogonal to the first direction is defined as a second direction. The first semiconductor chip and the second semiconductor chip are arranged spaced apart from each other in the second direction.

The redistribution layer is disposed across over the first semiconductor chip and the second semiconductor chip. The redistribution layer includes a first inductor and a second inductor. The first inductor and the second inductor are spaced apart and face each other in the first direction. The redistribution layer includes a plurality of wirings stacked in the first direction. The first inductor is configured by winding one of the plurality of wirings included in the redistribution layer in a plane orthogonal to the first direction. The second inductor is configured by winding another one of the plurality of wirings included in the redistribution layer in a plane orthogonal to the first direction.

SUMMARY

In the semiconductor device described in Patent Document 1, since the first inductor and the second inductor are configured by winding wirings included in the redistribution layer in a plane orthogonal to the first direction, the occupied area of the first inductor and the second inductor in plan view increases. Other objects and novel features will become apparent from the description of this specification and the accompanying drawings.

A semiconductor device according to the present disclosure includes a first semiconductor chip, a second semiconductor chip, and a redistribution layer. The first semiconductor chip and the second semiconductor chip are arranged spaced apart from each other in a second direction orthogonal to a first direction which is a thickness direction of the semiconductor device. The redistribution layer is disposed across over the first semiconductor chip and the second semiconductor chip. The redistribution layer includes a first inductor and a second inductor. The first inductor and the second inductor are spaced apart and face each other in a third direction orthogonal to the first direction and the second direction. The first inductor is electrically connected to the first semiconductor chip. The second inductor is electrically connected to the second semiconductor chip. The first inductor and the second inductor are wound across over the first semiconductor chip and the second semiconductor chip in a plane orthogonal to the third direction.

According to the semiconductor device of the present disclosure, it is possible to reduce the occupied area of the first inductor and the second inductor in plan view.

DETAILED DESCRIPTION

Figure 1:
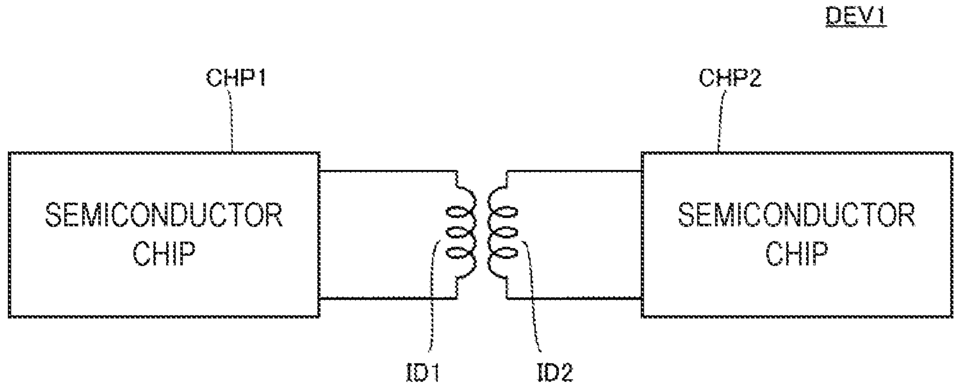
FIG. 1 is a schematic configuration diagram of a semiconductor device DEV1.

Details of embodiments of the present disclosure will be described with reference to the drawings. In the following drawings, the same or corresponding parts are denoted by the same reference numerals, and redundant description will not be repeated.

First Embodiment

A semiconductor device according to the first embodiment will be described. The semiconductor device according to the embodiment is defined as a semiconductor device DEV1.

Configuration of Semiconductor Device DEV1

FIG. 1 is a schematic configuration diagram of the semiconductor device DEV1. As shown in FIG. 1, the semiconductor device DEV1 includes a semiconductor chip CHP1, a semiconductor chip CHP2, an inductor ID1, and an inductor ID2. The inductor ID1 is electrically connected to the semiconductor chip CHP1. The inductor ID2 is electrically connected to the semiconductor chip CHP2. The inductor ID1 and the inductor ID2 are magnetically coupled. The inductor ID1 and the inductor ID2 are electrically isolated from each other.

The semiconductor chip CHP1 can transmit and receive signals to and from the semiconductor chip CHP2 via the inductor ID1 and the inductor ID2 in a state that the semiconductor chip CHP1 is electrically isolated from the semiconductor chip CHP2. The semiconductor device DEV1 is a digital isolator. However, the semiconductor device DEV1 is not limited to the digital isolator.

Figure 2:
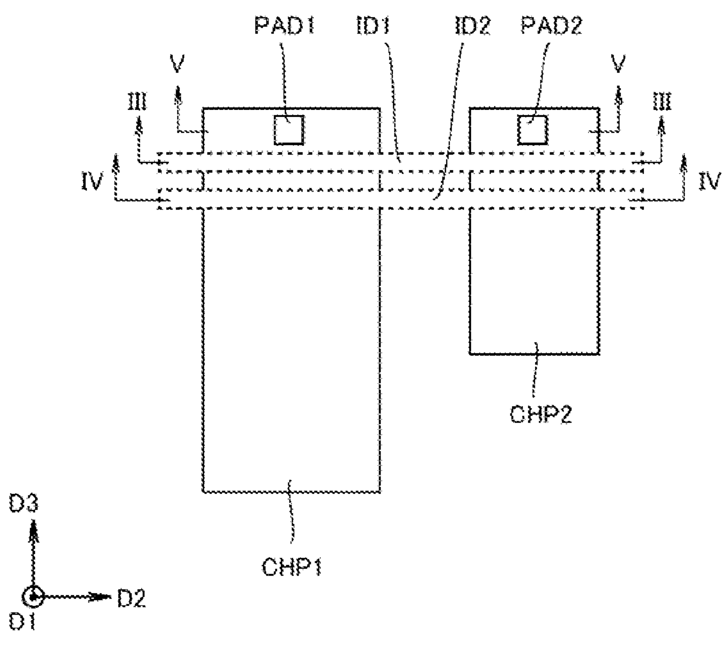
FIG. 2 is a plan view of the semiconductor device DEV1.
Figure 3:
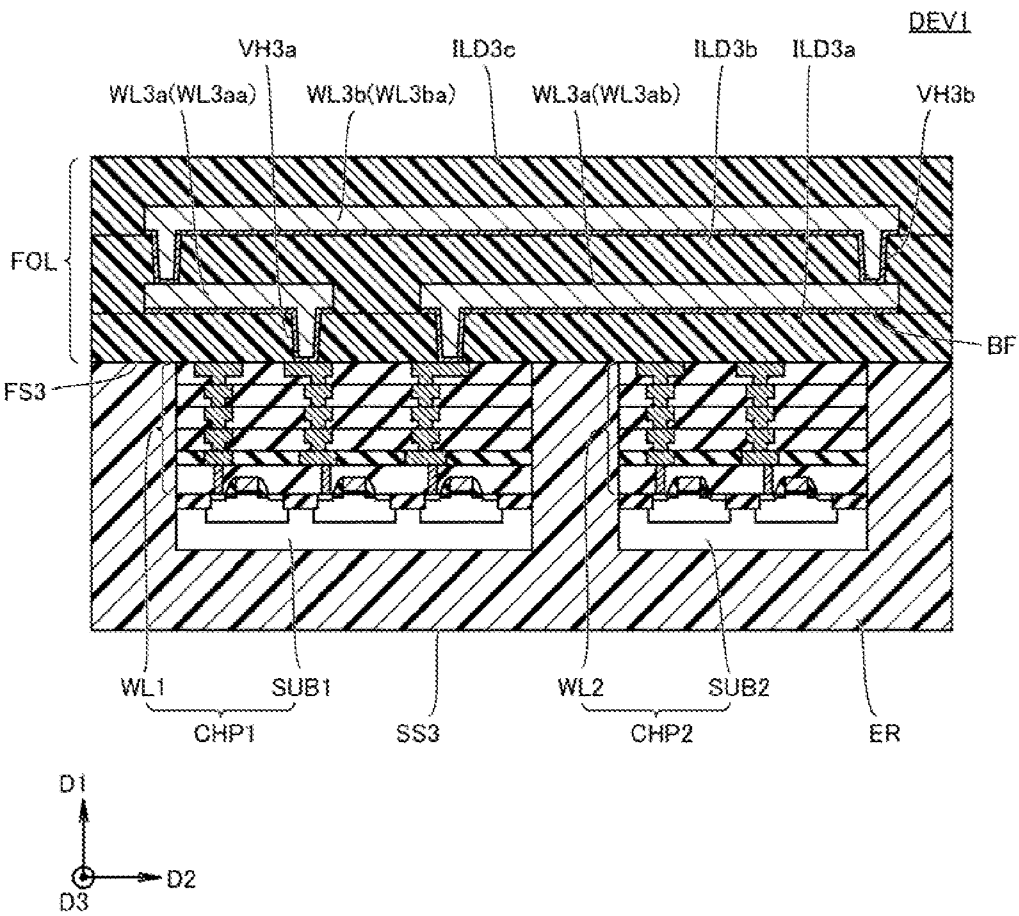
FIG. 3 is a cross-sectional view in III-III in FIG. 2.
Figure 4:
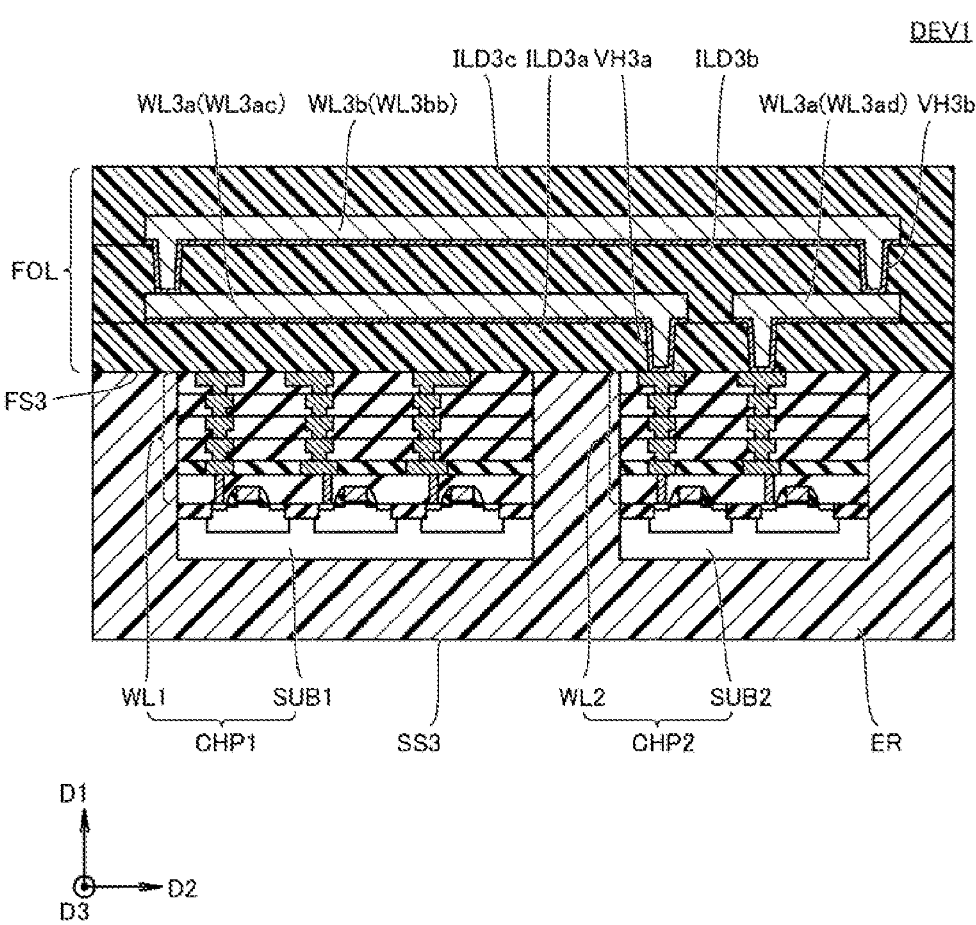
FIG. 4 is a cross-sectional view in IV-IV in FIG. 2.
Figure 5:
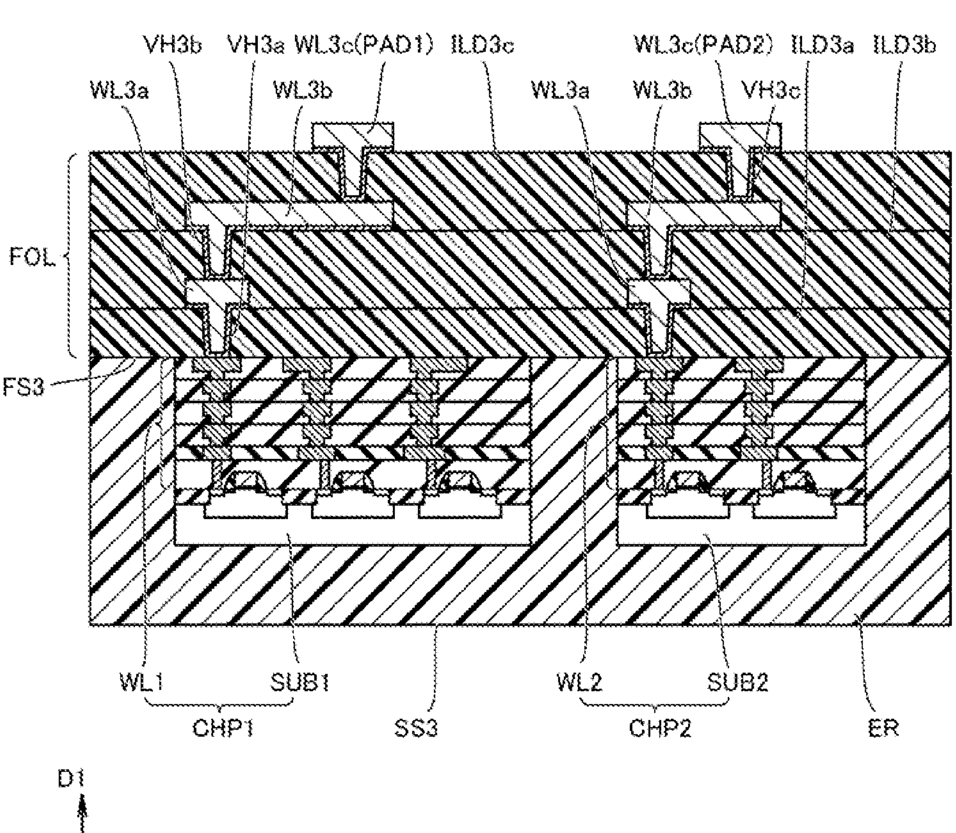
FIG. 5 is a cross-sectional view in V-V in FIG. 2.
Figure 6:
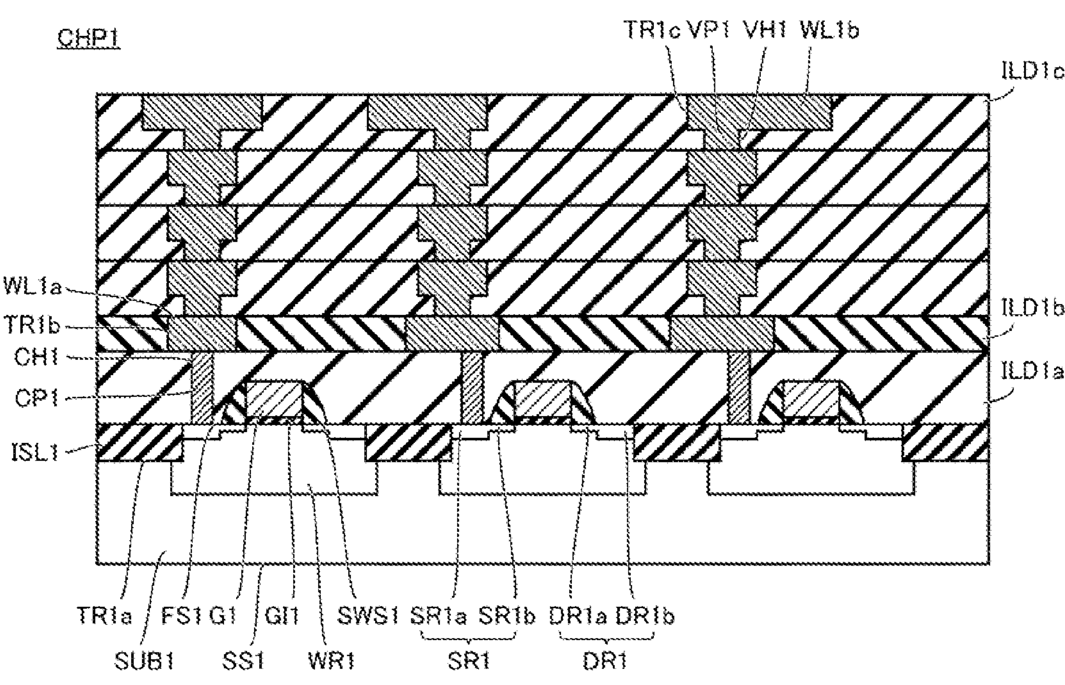
FIG. 6 is an enlarged cross-sectional view of a semiconductor chip CHP1.
Figure 6:
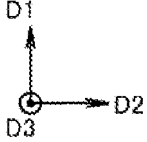
Figure 7:
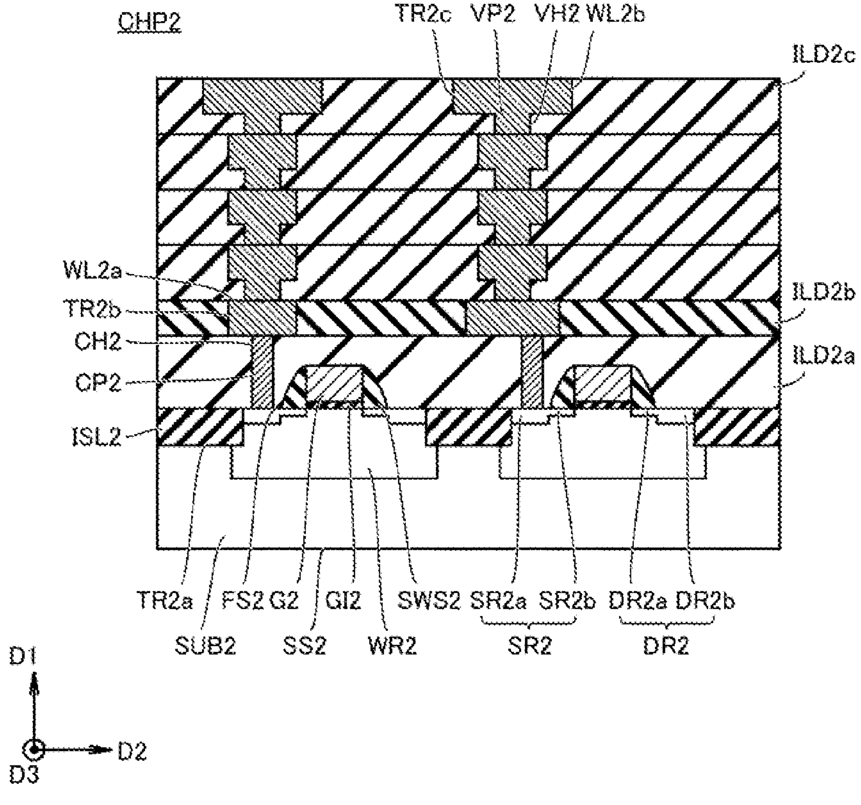
FIG. 7 is an enlarged cross-sectional view of a semiconductor chip CHP2.

FIG. 2 is a plan view of the semiconductor device DEV1. In FIG. 2, the illustration of the redistribution layer FOL is omitted, and the inductor ID1 and the inductor ID2 are indicated by dotted lines. FIG. 3 is a cross-sectional view in III-III in FIG. 2. FIG. 4 is a cross-sectional view in IV-IV in FIG. 2. FIG. 5 is a cross-sectional view in V-V in FIG. 2. FIG. 6 is an enlarged cross-sectional view of the semiconductor chip CHP1. FIG. 7 is an enlarged cross-sectional view of the semiconductor chip CHP2. As shown in FIGS. 2 to 7, the semiconductor device DEV1 includes the semiconductor chip CHP1, the semiconductor chip CHP2, a sealing resin ER, and the redistribution layer FOL.

The semiconductor chip CHP1 includes a semiconductor substrate SUB1, element isolation films ISL1, gate dielectric films GI1, gate electrodes G1, sidewall spacers SWS1, and a wiring layer WL1. The wiring layer WL1 includes an interlayer dielectric film ILD1*a*, contact plugs CP1, an interlayer dielectric film ILD1*b*, wirings WL1*a*, a plurality of interlayer dielectric films ILDIc, a plurality of wirings WL1*b*, and a plurality of via plugs VP1.

The semiconductor substrate SUB1 has a first surface FS1 and a second surface SS1. The first surface FS1 and the second surface SS1 are end surfaces along a thickness direction of the semiconductor substrate SUB1. The second surface SS1 is an opposite surface of the first surface FS1. The semiconductor substrate SUB1 is formed of, for example, monocrystalline silicon (Si).

The semiconductor substrate SUB1 includes source regions SR1, drain regions DR1, and well regions WR1. The source region SR1 and the drain region DR1 are formed in the first surface FS1 so as to be spaced apart from each other. The conductivity types of the source region SR1 and the drain region DR1 are the first conductivity type.

The source region SR1 includes a first portion SR1*a* and a second portion SR1*b*. The first portion SR1*a* is closer to the drain region DR1 than the second portion SR1*b*. The drain region DR1 includes a first portion DR1*a* and a second portion DR1*b*. The first portion DR1*a* is closer to the source region SR1 than the second portion DR1*b*. The dopant concentration in the first portion SR1*a* is lower than the dopant concentration in the second portion SR1*b*, and the dopant concentration in the first portion DR1*a* is lower than the dopant concentration in the second portion DR1*b*. That is, the source region SR1 and the drain region DR1 have an LDD (Lightly Doped Diffusion) structure.

The well region WR1 is formed in the first surface FS1 so as to surround the source region SR1 and the drain region DR1. The conductivity type of the well region WR1 is the second conductivity type. The second conductivity type is a conductivity type opposite the first conductivity type.

The gate dielectric film GIL is disposed on the first surface FS1. More specifically, the gate dielectric film GI1 is disposed on the first surface FS1 between the source region SR1 and the drain region DR1. The gate dielectric film GI1 is formed of, for example, silicon oxide. The gate electrode G1 is disposed on the gate dielectric film GI1. That is, the gate electrode G1 faces the well region WR1 between the source region SR1 and the drain region DR1 with the gate dielectric film GI1 interposed therebetween. The gate electrode G1 is formed of, for example, polycrystalline silicon containing dopants. The source region SR1, the drain region DR1, the well region WR1, the gate dielectric film GI1, and the gate electrode G1 constitute a transistor.

The sidewall spacer SWS1 is disposed on the first surface FS1. More specifically, the sidewall spacers SWS1 are disposed on the first portion SR1*a* and the first portion DR1*a* so as to be in contact with side surfaces of the gate electrode G1. The sidewall spacer SWS1 is formed of, for example, silicon nitride. The element isolation film ISL1 is disposed on the first surface FS1 so as to surround the well region WR1 in plan view. More specifically, trenches TR1*a* extending toward the second surface SS1 are formed in the first surface FS1. The element isolation film ISL1 is embedded in the trench TR1*a*. The element isolation film ISL1 is formed of, for example, silicon oxide.

The wiring layer WL1 is disposed on the first surface FS1. The interlayer dielectric film ILD1*a* is disposed on the first surface FS1 so as to cover the gate electrode G1, the sidewall spacer SWS1, and the element isolation film ISL1. The interlayer dielectric film ILD1*a* is formed of, for example, silicon oxide. Contact holes CH1 are formed in the interlayer dielectric film ILD1*a*. The source region SR1, the drain region DR1, or the gate electrode G1 is exposed from the contact hole CH1. The contact plug CP1 is embedded in the contact hole CH1. The lower end of the contact plug CP1 is electrically connected to the source region SR1, the drain region DR1, or the gate electrode G1. The contact plug CP1 is formed of, for example, tungsten (W).

The interlayer dielectric film ILD1*b* is disposed on the interlayer dielectric film ILD1*a*. The interlayer dielectric film ILD1*b* is formed of, for example, silicon oxide. Trenches TR1*b* are formed in the interlayer dielectric film ILD1*b*. The trench TR1*b* penetrates through the interlayer dielectric film ILD1*b* along the thickness direction. The wiring WL1*a* is embedded in the trench TR1*b*. The wiring WL1*a* is formed of, for example, copper (Cu). The wiring WL1*a* is electrically connected to an upper end of the contact plug CP1.

The plurality of interlayer dielectric films ILD1*c* are laminated and disposed on the interlayer dielectric film ILD1*b*. The interlayer dielectric film ILDIc is formed of silicon oxide. Trenches TR1*c* are formed in an upper surface of the interlayer dielectric film ILDIc. Via holes VH1 are formed in the interlayer dielectric film ILDIc. The via hole VH1 penetrates through the interlayer dielectric film ILD1*c* along the thickness direction. An upper end of the via hole VH1 is open at the bottom surface of the trench TR1*c*, and a lower end of the via hole VH1 is open at the lower surface of the interlayer dielectric film ILD1*c*.

The wiring WL1*b* is embedded in the trench TR1*c*. The via plug VP1 is embedded in the via hole VH1. The wiring WL1*b* and the via plug VP1 are integrally formed. The wiring WL1*b* and the via plug VP1 are formed of copper. The via plug VP1 connects the wiring WL1*a* to the lowermost wiring WL1*b*, and connects two adjacent wirings WL1*b* along the thickness direction of the wiring layer WL1.

The semiconductor chip CHP2 includes a semiconductor substrate SUB2, element isolation films ISL2, gate dielectric films GI2, gate electrodes G2, sidewall spacers SWS2, and a wiring layer WL2. The wiring layer WL2 includes an interlayer dielectric film ILD2*a*, contact plugs CP2, an interlayer dielectric film ILD2*b*, wirings WL2*a*, a plurality of interlayer dielectric films ILD2*c*, a plurality of wirings WL2*b*, and a plurality of via plugs VP2.

The semiconductor substrate SUB2 has a first surface FS2 and a second surface SS2. The first surface FS2 and the second surface SS2 are end surfaces along the thickness direction of the semiconductor substrate SUB2. The second surface SS2 is an opposite surface of the first surface FS2. The semiconductor substrate SUB2 is formed of, for example, monocrystalline silicon.

The semiconductor substrate SUB2 includes source regions SR2, drain regions DR2, and well regions WR2. The source region SR2 and the drain region DR2 are formed in the first surface FS2 so as to be spaced apart from each other. The conductivity types of the source region SR2 and the drain region DR2 are the first conductivity type.

The source region SR2 includes a first portion SR2*a* and a second portion SR2*b*. The first portion SR2*a* is closer to the drain region DR2 than the second portion SR2*b*. The drain region DR2 includes a first portion DR2*a* and a second portion DR2*b*. The first portion DR2*a* is closer to the source region SR2 than the second portion DR2*b*. The dopant concentration in the first portion SR2*a* is lower than the dopant concentration in the second portion SR2*b*, and the dopant concentration in the first portion DR2*a* is lower than the dopant concentration in the second portion DR2*b*. That is, the source region SR2 and the drain region DR2 have an LDD structure.

The well region WR2 is formed in the first surface FS2 so as to surround the source region SR2 and the drain region DR2. The conductivity type of the well region WR2 is the second conductivity type. The second conductivity type is a conductivity type opposite to the first conductivity type.

The gate dielectric film GI2 is disposed on the first surface FS2. More specifically, the gate dielectric film GI2 is disposed on the first surface FS2 between the source region SR2 and the drain region DR2. The gate dielectric film GI2 is formed of, for example, silicon oxide. The gate electrode G2 is disposed on the gate dielectric film GI2. That is, the gate electrode G2 faces the well region WR2 between the source region SR2 and the drain region DR2 with the gate dielectric film GI2 interposed therebetween. The gate electrode G2 is formed of, for example, polycrystalline silicon containing dopants. The source region SR2, the drain region DR2, the well region WR2, the gate dielectric film GI2, and the gate electrode G2 constitute a transistor.

The sidewall spacer SWS2 is disposed on the first surface FS2. More specifically, the sidewall spacers SWS2 are disposed on the first portion SR2*a* and the first portion DR2*a* so as to be in contact with the side surfaces of the gate electrode G2. The sidewall spacer SWS2 is formed of, for example, silicon nitride. The element isolation film ISL2 is disposed on the first surface FS2 so as to surround the well region WR2 in plan view. More specifically, trenches TR2*a* extending toward the second surface SS2 are formed in the first surface FS2. The element isolation film ISL2 is embedded in the trench TR2*a*. The element isolation film ISL2 is formed of, for example, silicon oxide.

The wiring layer WL2 is disposed on the first surface FS2. The interlayer dielectric film ILD2*a* is disposed on the first surface FS2 so as to cover the gate electrode G2, the sidewall spacer SWS2, and the element isolation film ISL2. The interlayer dielectric film ILD2*a* is formed of, for example, silicon oxide. Contact holes CH2 are formed in the interlayer dielectric film ILD2*a*. The source region SR2, the drain region DR2, or the gate electrode G2 is exposed from the contact hole CH2. The contact plug CP2 is embedded in the contact hole CH2. A lower end of the contact plug CP2 is electrically connected to the source region SR2, the drain region DR2, or the gate electrode G2. The contact plug CP2 is formed of, for example, tungsten.

The interlayer dielectric film ILD2*b* is disposed on the interlayer dielectric film ILD2*a*. The interlayer dielectric film ILD2*b* is formed of, for example, silicon oxide. Trenches TR2*b* are formed in the interlayer dielectric film ILD2*b*. The trench TR2*b* penetrates through the interlayer dielectric film ILD2*b* along the thickness direction. The wiring WL2*a* is embedded in the trench TR2*b*. The wiring WL2*a* is formed of, for example, copper. The wiring WL2*a* is electrically connected to an upper end of the contact plug CP2.

The plurality of interlayer dielectric films ILD2*c* are laminated and disposed on the interlayer dielectric film ILD2*b*. The interlayer dielectric film ILD2*c* is formed of silicon oxide. Trenches TR2*c* are formed in an upper surface of the interlayer dielectric film ILD2*c*. Via holes VH2 are formed in the interlayer dielectric film ILD2*c*. The via hole VH2 penetrates through the interlayer dielectric film ILD2*c* along the thickness direction. An upper end of the via hole VH2 is open at the bottom surface of the trench TR2*c*, and a lower end of the via hole VH2 is open at the lower surface of the interlayer dielectric film ILD2*c*.

The wiring WL2*b* is embedded in the trench TR2*c*. The via plug VP2 is embedded in the via hole VH2. The wiring WL2*b* and the via plug VP2 are integrally formed. The wiring WL2*b* and the via plug VP2 are formed of copper. The via plug VP2 connects the wiring WL2*a* to the lowermost wiring WL2*b*, and connects two adjacent wirings WL2*b* along the thickness direction of the wiring layer WL2.

The sealing resin ER seals the semiconductor chip CHP1 and the semiconductor chip CHP2 such that an upper surface of the wiring layer WL1 and an upper surface of the wiring layer WL1 are exposed. The sealing resin ER has a first surface FS3 and a second surface SS3. The first surface FS3 and the second surface SS3 are end surfaces of the sealing resin ER in the thickness direction. The first surface FS3 is flush with the upper surface of the wiring layer WL1 and the upper surface of the wiring layer WL2. The second surface SS3 is an opposite surface of the first surface FS3. The sealing resin ER is formed of a thermosetting resin material such as an epoxy resin.

The redistribution layer FOL is disposed on the first surface FS3 across over the semiconductor chip CHP1 (wiring layer WL1) and the semiconductor chip CHP2 (wiring layer WL2). The redistribution layer FOL is disposed on the first surface FS3 so as to overlap with the semiconductor chip CHP1 (wiring layer WL1) and the semiconductor chip CHP2 (wiring layer WL2). The redistribution layer FOL includes an interlayer dielectric film ILD3*a*, an interlayer dielectric film ILD3*b*, an interlayer dielectric film ILD3*c*, wirings WL3*a*, wirings WL3*b*, and wirings WL3*c*.

The interlayer dielectric film ILD3*a* is disposed on the first surface FS3 across over the semiconductor chip CHP1 (wiring layer WL1) and the semiconductor chip CHP2 (wiring layer WL2). The interlayer dielectric film ILD3*a* is disposed on the first surface FS3 so as to overlap with the semiconductor chip CHP1 (wiring layer WL1) and the semiconductor chip CHP2 (wiring layer WL2). The interlayer dielectric film ILD3*a* is formed of, for example, a resin material such as polyimide. Via holes VH3*a* are formed in the interlayer dielectric film ILD3*a*. The via hole VH3*a* penetrates through the interlayer dielectric film ILD3*a* along the thickness direction.

The wiring WL3*a* is disposed on the interlayer dielectric film ILD3*a*. The wiring WL3*a* is also embedded in the via hole VH3*a*. Thus, the wiring WL3*a* is electrically connected to the uppermost wiring WL1*b* or the uppermost wiring WL2*b*. The wiring WL3*a* is formed of, for example, copper.

The interlayer dielectric film ILD3*b* is disposed on the interlayer dielectric film ILD3*a*. The interlayer dielectric film ILD3*b* is formed of, for example, a resin material such as polyimide. Via holes VH3*b* are formed in the interlayer dielectric film ILD3*b*. The via hole VH3*b* penetrates through the interlayer dielectric film ILD3*b* along the thickness direction. The wiring WL3*b* is disposed on the interlayer dielectric film ILD3*b*. The wiring WL3*b* is also embedded in the via hole VH3*b*. Thus, the wiring WL3*b* is electrically connected to the wiring WL3*a*. The wiring WL3*b* is formed of, for example, copper.

The interlayer dielectric film ILD3*c* is disposed on the interlayer dielectric film ILD3*b*. The interlayer dielectric film ILD3*c* is formed of, for example, a resin material such as polyimide. Via holes VH3*c* are formed in the interlayer dielectric film ILD3*c*. The via hole VH3*c* penetrates through the interlayer dielectric film ILD3*c* along the thickness direction. The wiring WL3*c* is disposed on the interlayer dielectric film ILD3*c*. The wiring WL3*c* is also embedded in the via hole VH3*c*. Thus, the wiring WL3*c* is electrically connected to the wiring WL3*b*. The wiring WL3*c* is formed of, for example, copper.

The wiring WL3*c* includes a pad electrode PAD1 and a pad electrode PAD2. The pad electrode PAD1 is electrically connected to the semiconductor chip CHP1 by the wiring WL3*b* and the wiring WL3*a*. The pad electrode PAD2 is electrically connected to the semiconductor chip CHP2 by the wiring WL3*a* and the wiring WL3*b*. Note that the wiring WL3*a*, the wiring WL3*b*, and the wiring WL3*c* have a base film BF as their base. The base film BF is configured by a barrier metal layer and a seed layer disposed on the barrier metal layer.

A thickness direction of the semiconductor device DEV1 is defined as a first direction D1. A direction orthogonal to the first direction D1 is defined as a second direction D2. A direction orthogonal to the first direction D1 and the second direction D2 is defined as a third direction D3. The semiconductor chip CHP1 and the semiconductor chip CHP2 are arranged spaced apart from each other in the second direction D2.

The inductor ID1 is wound across over the semiconductor chip CHP1 and the semiconductor chip CHP2 in a plane orthogonal to the third direction D3. The inductor ID1 is formed so as to overlap with the semiconductor chip CHP1 and the semiconductor chip CHP2. The inductor ID1 is configured by the wiring WL3*a* and the wiring WL3*b*. More specifically, the wiring WL3*a* has a straight portion WL3*aa* and a straight portion WL3*ab*, and the wiring WL3*b* has a straight portion WL3*ba*. The straight portion WL3*aa*, the straight portion WL3*ab*, and the straight portion WL3*ba* extend along the second direction D2 in a cross-sectional view orthogonal to the third direction D3.

One end (the right side in FIG. 3) of the straight portion WL3*aa* in the second direction D2 is electrically connected to the semiconductor chip CHP1 by the wiring WL3*a* embedded in the via hole VH3*a*. The other end (the left side in FIG. 3) of the straight portion WL3*ab* in the second direction D2 is electrically connected to the semiconductor chip CHP1 by the wiring WL3*a* embedded in the via hole VH3*a*. Both ends of the straight portion WL3*ba* in the second direction D2 are electrically connected to the other end of the straight portion WL3*aa* in the second direction D2 and one end of the straight portion WL3*ab* in the second direction D2 by the wiring WL3*b* embedded in the via hole VH3*b*, respectively.

The inductor ID2 is wound across over the semiconductor chip CHP1 and the semiconductor chip CHP2 in a plane orthogonal to the third direction D3. The inductor ID2 is formed so as to overlap with the semiconductor chip CHP1 and the semiconductor chip CHP2. The inductor ID2 is configured by the wiring WL3*a* and the wiring WL3*b*. More specifically, the wiring WL3*a* has a straight portion WL3*ac* and a straight portion WL3*ad*, and the wiring WL3*b* has a straight portion WL3*bb*. The straight portion WL3*ac*, the straight portion WL3*ad*, and the straight portion WL3*bb* extend along the second direction D2 in a cross-sectional view orthogonal to the third direction D3.

One end of the straight portion WL3*ac* in the second direction D2 is electrically connected to the semiconductor chip CHP2 by the wiring WL3*a* embedded in the via hole VH3*a*. The other end of the straight portion WL3*ad* in the second direction D2 is electrically connected to the semiconductor chip CHP2 by the wiring WL3*a* embedded in the via hole VH3*a*. Both ends of the straight portion WL3*bb* in the second direction D2 are electrically connected to the other end of the straight portion WL3*ac* in the second direction D2 and one end of the straight portion WL3*ad* in the second direction D2 by the wiring WL3*b* embedded in the via hole VH3*b*.

The inductor ID1 and the inductor ID2 are spaced apart and face each other in the third direction D3. The inductor ID1 and the inductor ID2 are insulated from each other by the interlayer dielectric film ILD3*a*, the interlayer dielectric film ILD3*b*, and the interlayer dielectric film ILD3*c*. The inductor ID1 and the inductor ID2 are magnetically coupled to each other. Therefore, the semiconductor chip CHP1 and the semiconductor chip CHP2 can transmit and receive signals via the inductor ID1 and the inductor ID2 while being insulated from each other.

Manufacturing Method of Semiconductor Device DEV1

A manufacturing method of the semiconductor device DEV1 is described below.

Figure 8:
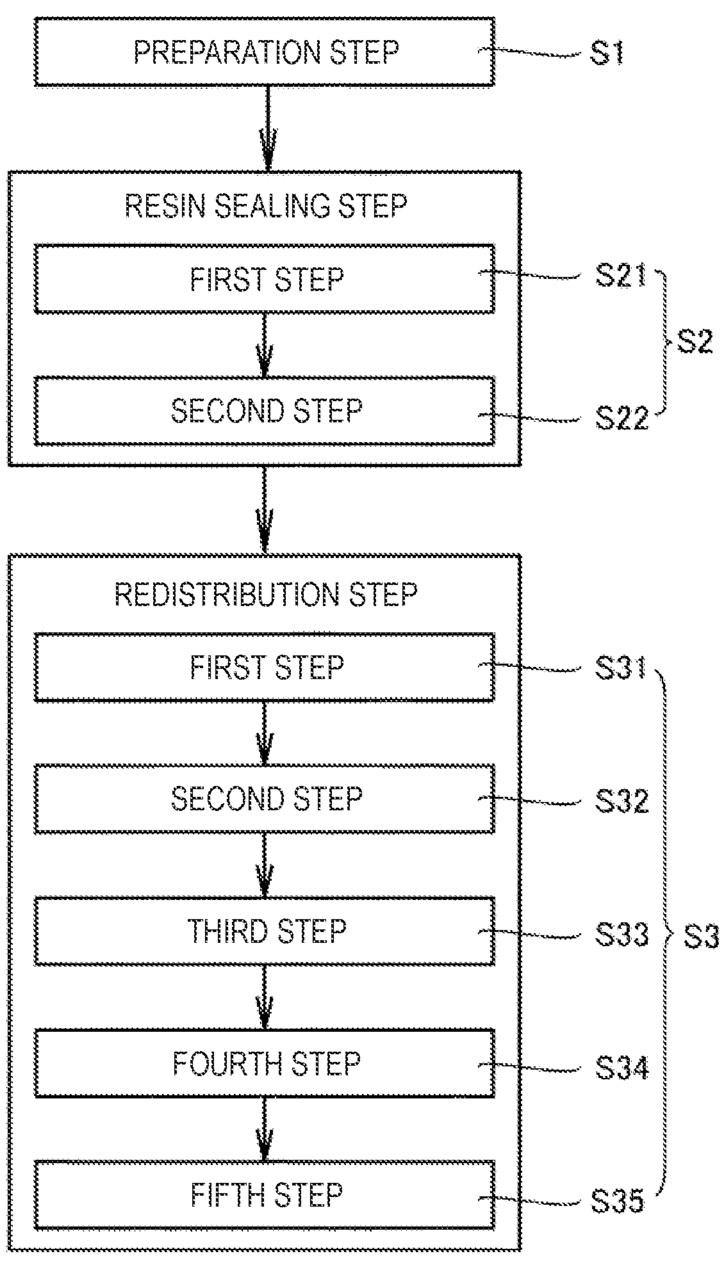
FIG. 8 is a process diagram showing a manufacturing method of the semiconductor device DEV1.

FIG. 8 is a process diagram showing the manufacturing method of the semiconductor device DEV1. As shown in FIG. 8, the manufacturing method of the semiconductor device DEV1 includes a preparation step S1, a resin sealing step S2, and a redistribution step S3. The resin sealing step S2 is performed after the preparation step S1. The redistribution step S3 is performed after the resin sealing step S2.

The resin sealing step S2 includes a first step S21 and a second step S22. The second step S22 is performed after the first step S21. The redistribution step S3 includes a first step S31, a second step S32, a third step S33, a fourth step S34, and a fifth step S35. The second step S32 is performed after the first step S31. The third step S33 is performed after the second step S32. The fourth step S34 is performed after the third step S33. The fifth step S35 is performed after the fourth step S34.

In the preparation step S1, the semiconductor chip CHP1 and the semiconductor chip CHP2 are prepared. A manufacturing method of the semiconductor chip CHP1 and the semiconductor chip CHP2 may be performed by conventionally known methods, and therefore will not be described here.

Figure 9:
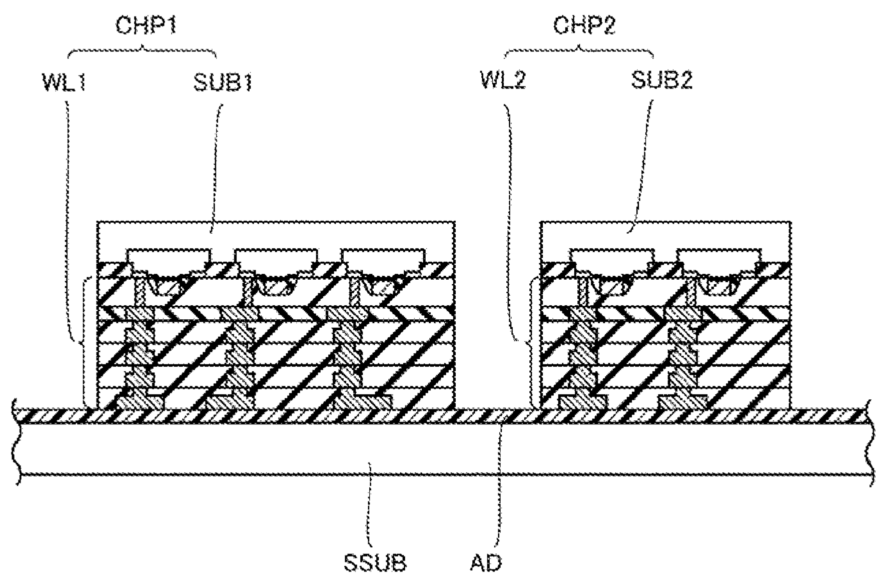
FIG. 9 is a cross-sectional view showing a first step S21.

FIG. 9 is a cross-sectional view showing the first step S21. As shown in FIG. 9, in the first step S21, the semiconductor chip CHP1 and the semiconductor chip CHP2 are bonded to a support substrate SSUB by an adhesive AD. At this time, the semiconductor chip CHP1 on the wiring layer WL1 side and the semiconductor chip CHP2 on the wiring layers WL2 side are bonded to the support substrate SSUB.

Figure 10:
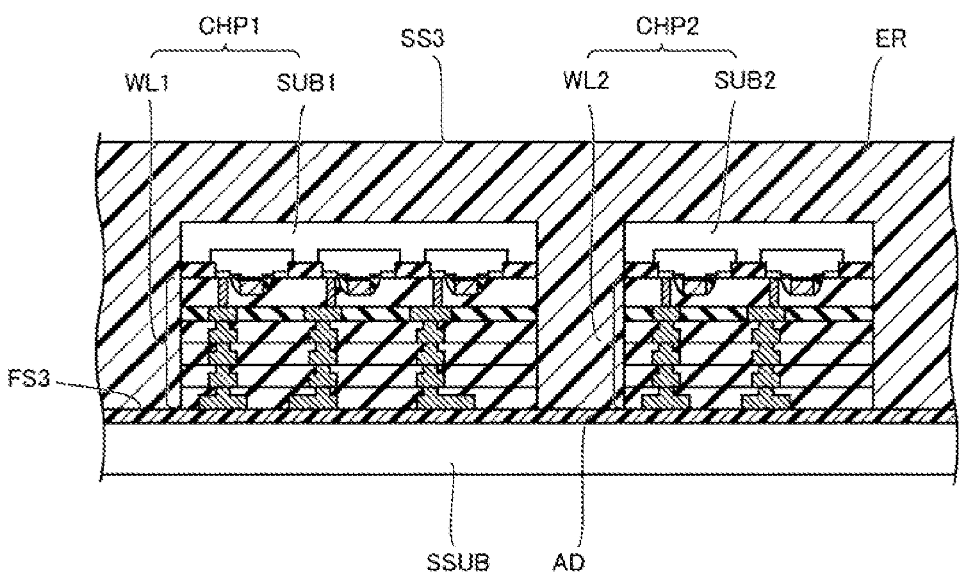
FIG. 10 is a cross-sectional view showing a second step S22.

FIG. 10 is a cross-sectional view showing the second step S22. As shown in FIG. 10, in the second step S22, a sealing resin ER is disposed on the support substrate SSUB so as to cover the semiconductor chip CHP1 and the semiconductor chip CHP2. After the sealing resin ER is disposed on the support substrate SSUB, the second surface SS3 is polished and planarized. This polishing is performed, for example, by CMP (Chemical Mechanical Polishing). After this polishing is performed, the support substrate SSUB is removed from the semiconductor chip CHP1 and the semiconductor chip CHP2.

Figure 11:
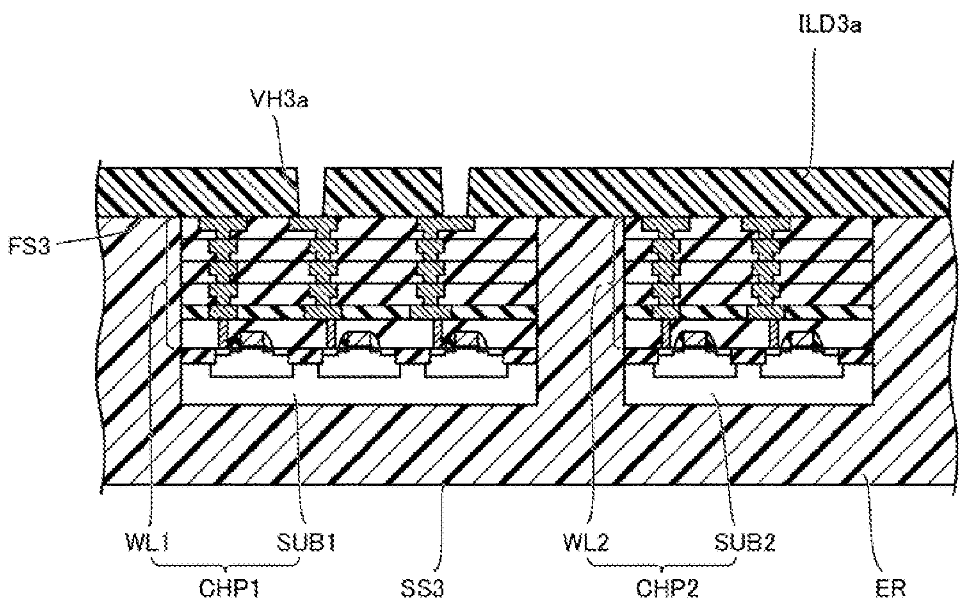
FIG. 11 is a cross-sectional view showing a first step S31.

FIG. 11 is a cross-sectional view showing the first step S31. As shown in FIG. 11, in the first step S31, the interlayer dielectric film ILD3*a* is formed. In the forming the interlayer dielectric film ILD3*a*, first, a constituent material of the interlayer dielectric film ILD3*a* is formed on the first surface FS3. Second, the via holes VH3*a* are formed by exposing and developing the formed constituent material of the interlayer dielectric film ILD3*a*.

Figure 12:
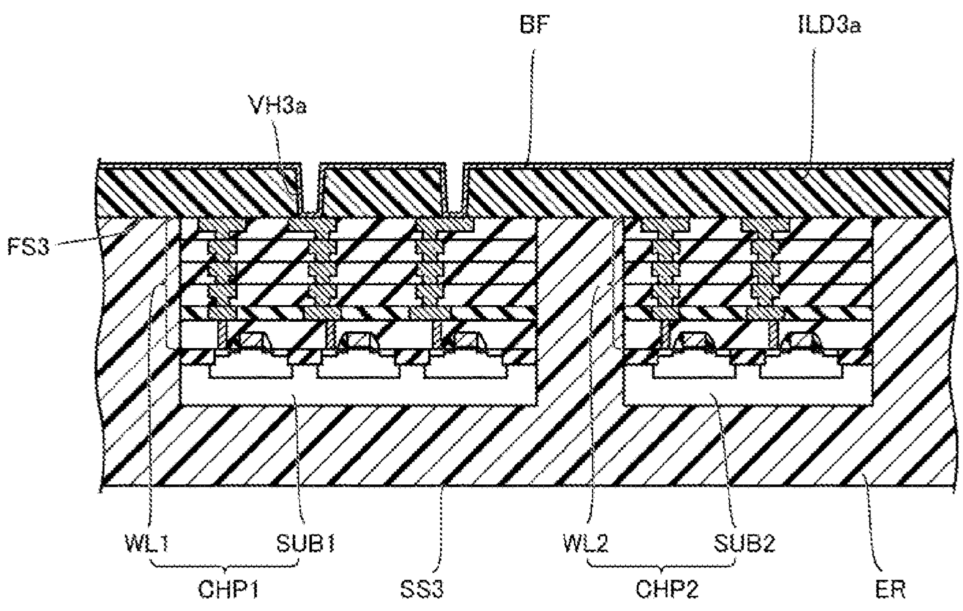
FIG. 12 is a cross-sectional view showing a second step S32.
Figure 13:
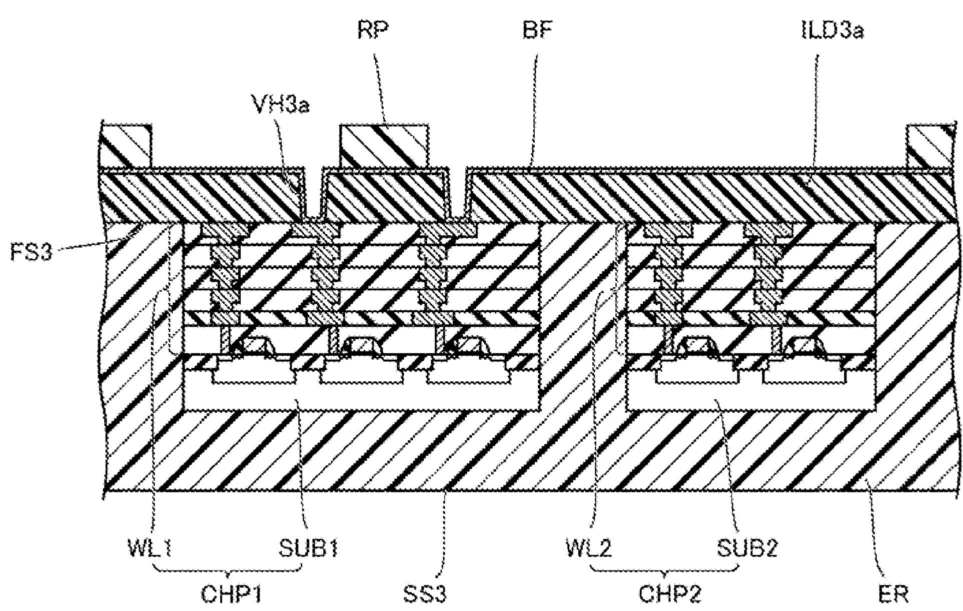
FIG. 13 is a cross-sectional view showing a third step S33.

FIG. 12 is a cross-sectional view showing the second step S32. As shown in FIG. 12, in the second step S32, the base film BF is formed on the interlayer dielectric film ILD3*a*, on the inner wall surface of the via hole VH3*a*, and on the wiring WL1*b* (wiring WL2*b*) exposed from the via hole VH3*a*. FIG. 13 is a cross-sectional view showing the third step S33. As shown in FIG. 13, in the third step S33, a resist pattern RP is formed on the base film BF. The resist pattern RP is formed by forming a photoresist material on the base film BF, exposing, developing and patterning the formed photoresist material.

Figure 14:
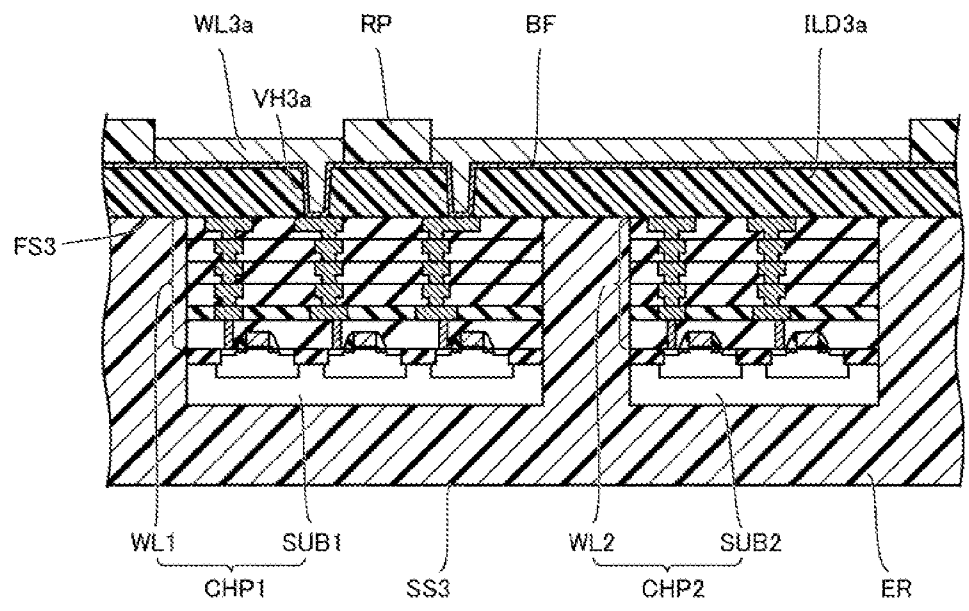
FIG. 14 is a cross-sectional view showing a fourth step S34.
Figure 15:
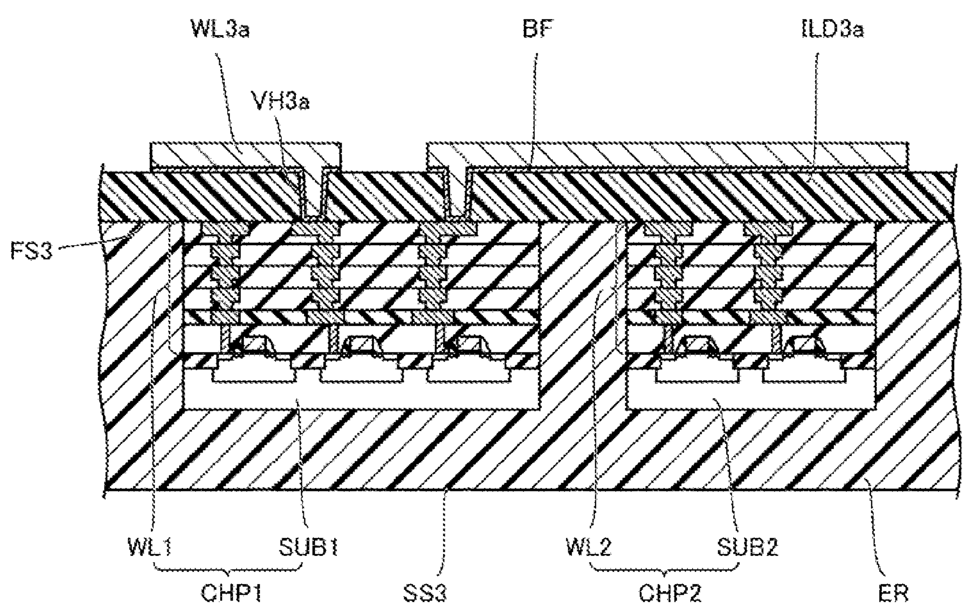
FIG. 15 is a cross-sectional view showing a fifth step S35.

FIG. 14 is a cross-sectional view showing the fourth step S34. As shown in FIG. 14, in the fourth step S34, the wiring WL3*a* is formed on the base film BF exposed from the resist pattern RP. The wiring WL3*a* is formed by performing electroplating on the base film BF which is exposed from the resist pattern RP by energizing the base film BF. FIG. 15 is a cross-sectional view showing the fifth step S35. As shown in FIG. 15, in the fifth step S35, after the resist pattern RP is removed, the base film BF underlying the resist pattern RP is removed by etching.

By repeating the same steps from the first step S31 to the fifth step S35, the interlayer dielectric film ILD3*b*, the wirings WL3*b*, the interlayer dielectric film ILD3*c* and the wirings WL3*c* are formed. After the redistribution step S3 is performed, it is singulated into the semiconductor device DEV1. Thus, the semiconductor device DEV1 having the structure shown in FIG. 2 is formed.

Effects of Semiconductor Device DEV1

The effects of the semiconductor device DEV1 are described below.

In the semiconductor device DEV1, the inductor ID1 and the inductor ID2 are wound in a plane orthogonal to the third direction D3. Therefore, in the semiconductor device DEV1, the occupied area of the inductor ID1 and the inductor ID2 in plan view can be made smaller than when the inductor ID1 and the inductor ID2 are wound in a plane orthogonal to the first direction D1.

In the semiconductor device DEV1, since the inductor ID1 and the inductor ID2 are formed across over the semiconductor chip CHP1 and the semiconductor chip CHP2, the inductance value of the inductor ID1 and the inductor ID2 can be ensured because the length of wiring configuring the inductor ID1 and the inductor ID2 can be ensured.

When the inductor ID1 and the inductor ID2 are spaced apart and face each other in the first direction D1, the dielectric breakdown voltage between the inductor ID1 and the inductor ID2 is determined by the thickness of the interlayer dielectric film of the redistribution layer FOL between the inductor ID1 and the inductor ID2. A modification in the thickness of the interlayer dielectric film of the redistribution layer FOL between the inductor ID1 and the inductor ID2 increases the manufacturing cost. When the thickness of the interlayer dielectric film of redistribution layer FOL increases, the semiconductor chip CHP1 and the semiconductor chip CHP2 are bent due to stresses from the interlayer dielectric film.

On the other hand, in the semiconductor device DEV1, the dielectric breakdown voltage between the inductor ID1 and the inductor ID2 is determined by the distance between the inductor ID1 and the inductor ID2 in the third direction D3. The distance between the inductor ID1 and the inductor ID2 in the third direction D3 can be freely set, and the breakdown voltage between the inductor ID1 and the inductor ID2 can be easily secured in the semiconductor device DEV1. In addition, in the semiconductor device DEV1, since the thickness of the interlayer dielectric film of the redistribution layer FOL does not need to be increased in order to secure the dielectric breakdown voltage between the inductor ID1 and the inductor ID2, it is possible to prevent the semiconductor chip CHP1 and the semiconductor chip CHP2 from being bent.

Second Embodiment

A semiconductor device according to the second embodiment will be described. The semiconductor device according to the second embodiment is defined as a semiconductor device DEV2. Here, differences from the semiconductor device DEV1 will be mainly described, and redundant description will not be repeated.

Configuration of Semiconductor Device DEV2

The configuration of the semiconductor device DEV2 is described below.

Figure 16:
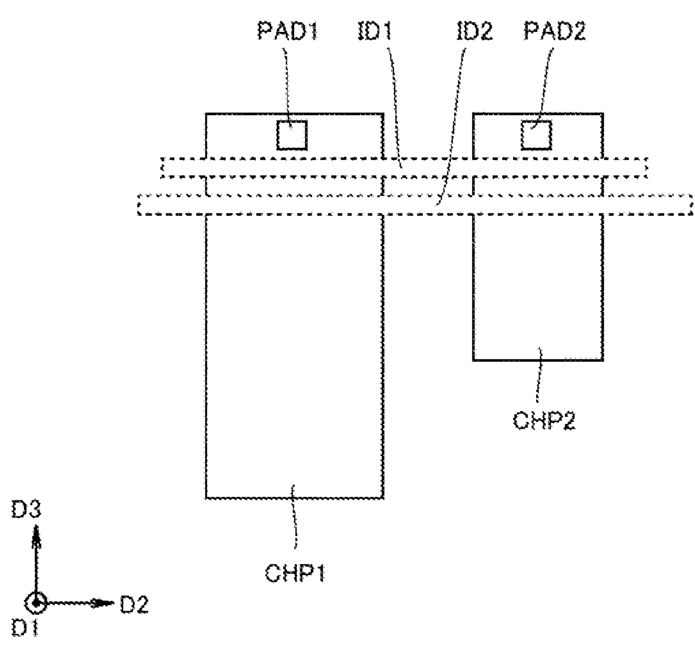
FIG. 16 is a plan view of a semiconductor device DEV2.

FIG. 16 is a plan view of the semiconductor device DEV2. In FIG. 16, the illustration of the redistribution layer FOL is omitted, and the inductor ID1 and the inductor ID2 are indicated by dotted lines. As shown in FIG. 16, in the semiconductor device DEV2, one end part (the right side in FIG. 16) of the inductor ID1 in the second direction D2 is at a position shifted in the second direction D2 from one end part of the inductor ID2 in the second direction D2. In the semiconductor device DEV2, the other end (the left side in FIG. 16) of the inductor ID1 in the second direction D2 is at a position shifted in the second direction D2 from the other end of the inductor ID2 in the second direction D2.

More specifically, in the semiconductor device DEV2, a width of the inductor ID1 in the second direction D2 is smaller than a width of the inductor ID2 in the second direction D2, and one end part of the inductor ID1 and the other end part of the inductor ID1 in the second direction D2 are inside in the second direction D2 than one end part of the inductor ID2 and the other end part of the inductor D2 in the second In these respects, the direction D2, respectively. configuration of the semiconductor device DEV2 is different from the configuration of the semiconductor device DEV1. Although not shown, the width of the inductor ID1 in the second direction D2 may be larger than the width of the inductor ID2 in the second direction D2, and one end part of the inductor ID1 and the other end part of the inductor ID1 in the second direction D2 may be outside in the second direction D2 than one end part of the inductor ID2 and the other end part of the inductor ID2 in the second direction D2, respectively.

Figure 17:
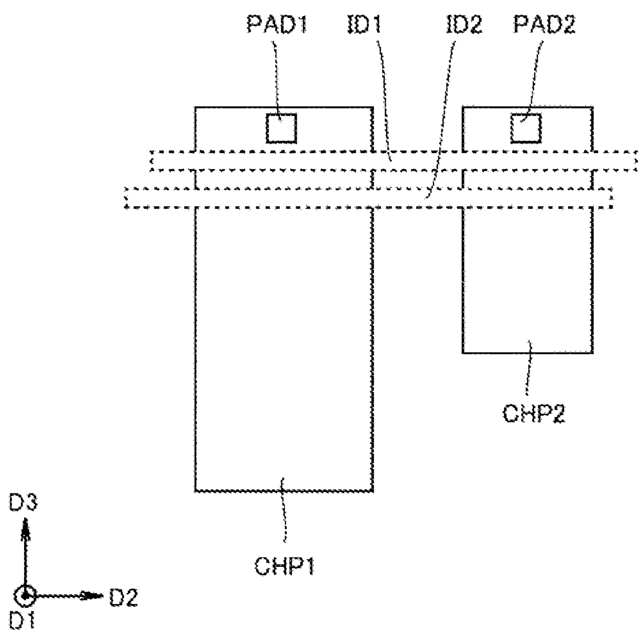
FIG. 17 is a plan view of the semiconductor device DEV2 according to a modified example.

FIG. 17 is a plan view of the semiconductor device DEV2 according to a modified example. In FIG. 17, the illustration of the redistribution layer FOL is omitted, and the inductor ID1 and the inductor ID2 are indicated by dotted lines. As shown in FIG. 17, in the semiconductor device DEV2, one end part of the inductor ID1 and the other end part of the inductor ID1 in the second direction D2 may be at positions shifted in the second direction D2 from one end part of the inductor ID2 and the other end part of the inductor ID2 in the second direction D2, and the width of the inductor ID1 in the second direction D2 may be equal to the width of the inductor ID2 in the second direction D2.

Effects of Semiconductor Device DEV2

The effects of the semiconductor device DEV2 are described below.

Electric field concentration is likely to occur at both end parts of the inductor ID1 and the inductor ID2 in the second direction D2. In the semiconductor device DEV2, one end part of the inductor ID1 and the other end part of the inductor ID1 in the second direction D2 are at positions shifted in the second direction D2 from one end part of the inductor ID2 and the other end part of the inductor ID2 in the second direction D2, respectively, so that the position where the electric field concentration is likely to occur in the inductor ID1 and the position where the electric field concentration is likely to occur in the inductor ID2 are at positions shifted from each other. Therefore, according to the semiconductor device DEV2, the dielectric breakdown voltage between the inductor ID1 and the inductor ID2 is easily secured.

Third Embodiment

A semiconductor device according to the third embodiment will be described. The semiconductor device according to the third embodiment is defined as a semiconductor device DEV3. Here, differences from the semiconductor device DEV1 will be mainly described, and redundant description will not be repeated.

Configuration of Semiconductor Device DEV3

The configuration of the semiconductor device DEV3 is described below.

Figure 18:
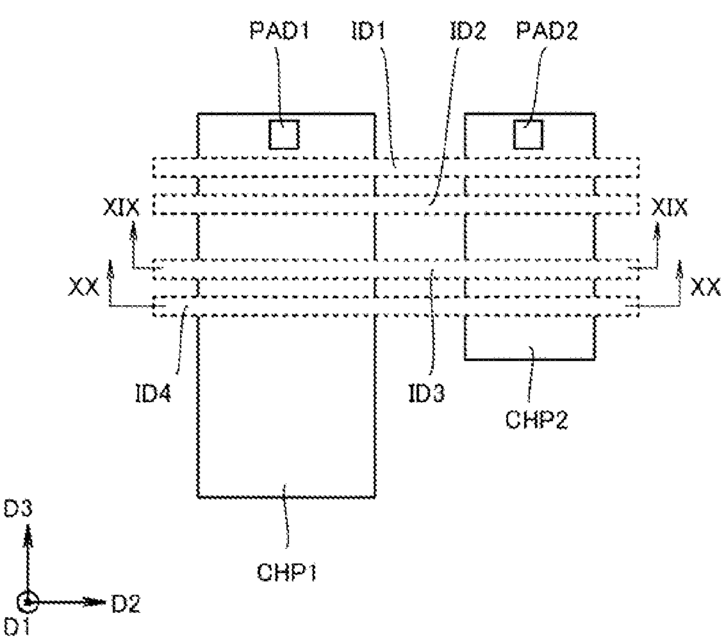
FIG. 18 is a plan view of a semiconductor device DEV3.
Figure 19:
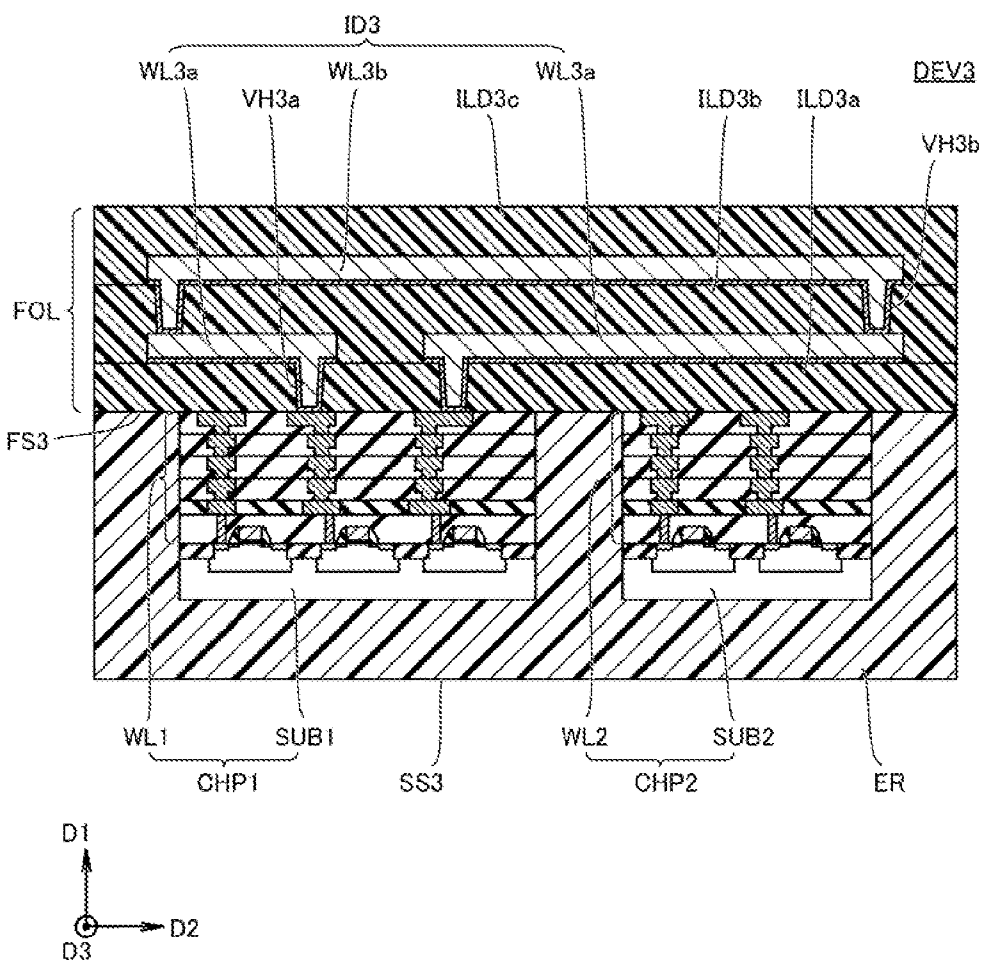
FIG. 19 is a cross-sectional view in XIX-XIX in FIG. 18.
Figure 20:
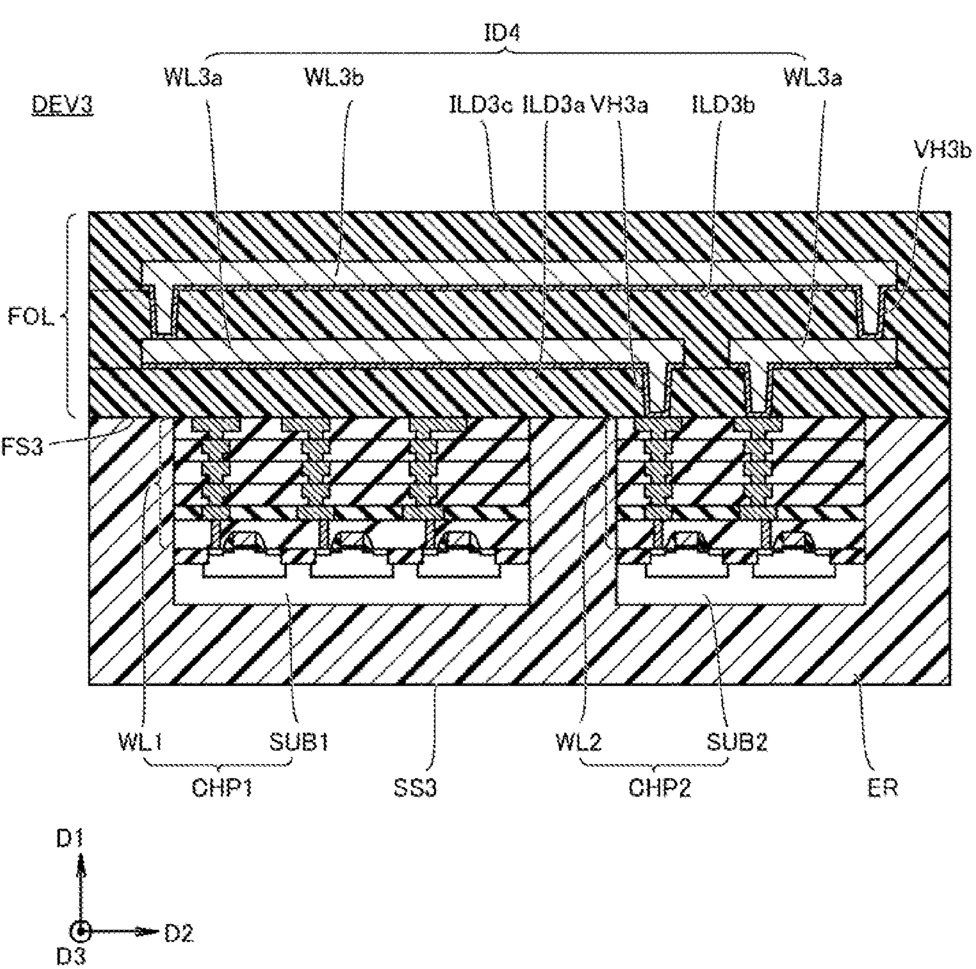
FIG. 20 is a cross-sectional view in XX-XX in FIG. 18.

FIG. 18 is a plan view of the semiconductor device DEV3. In FIG. 18, the illustration of the redistribution layer FOL is omitted, the inductor ID1, the inductor ID2, the inductor ID3 and the inductor ID4 are shown by the dotted line. FIG. 19 is a cross-sectional view in XIX-XIX in FIG. 18. FIG. 20 is a cross-sectional view in XX-XX in FIG. 18. As shown in FIGS. 18 to 20, the semiconductor device DEV3 further includes an inductor ID3 and an inductor ID4. The inductor ID3 is wound across over the semiconductor chip CHP1 and the semiconductor chip CHP2 in a plane orthogonal to the third direction D3. The inductor ID3 is formed so as to overlap with the semiconductor chip CHP1 and the semiconductor chip CHP2. The inductor ID3 is configured by the wiring WL3*a* and the wiring WL3*b*. The inductor ID3 is electrically connected to the semiconductor chip CHP1.

The inductor ID4 is wound across over the semiconductor chip CHP1 and the semiconductor chip CHP2 in a plane orthogonal to the third direction D3. The inductor ID4 is formed so as to overlap with the semiconductor chip CHP 1 and the semiconductor chip CHP2. The inductor ID4 is configured by the wiring WL3*a* and the wiring WL3*b*. The inductor ID4 is electrically connected to the semiconductor chip CHP2. The inductor ID3 and the inductor ID4 are spaced apart and face each other in the third direction D3. That is, the inductor ID3 and the inductor ID4 are magnetically coupled while being electrically insulated from each other. The inductor ID2 is located, for example, between the inductor ID1 and the inductor ID3 in the third direction D3. The inductor ID3 is located, for example, between the inductor ID2 and the inductor ID4 in the third direction D3.

A distance between the inductor ID2 and the inductor ID3 in the third direction D3 is defined as a first distance. A distance between the inductor ID1 and the inductor ID2 in the third direction D3 is defined as a second distance, and a distance between the inductor ID3 and the inductor ID4 in the third direction D3 is defined as a third distance. The first distance is, for example, larger than the second distance and the third distance. The first distance is preferable 10 times or more than the second distance and the third distance.

The inductor ID1 and the inductor ID3 are independent of each other. The inductor ID2 and the inductor ID4 are independent of each other. In these respects, the configuration of the semiconductor device DEV3 is different from the configuration of the semiconductor device DEV1.

Effects of Semiconductor Device DEV3

The effects of the semiconductor device DEV3 are described below.

In the semiconductor device DEV3, the inductor ID1 and the inductor ID3 are independent of each other, and the inductor ID2 and the inductor ID4 are independent of each other. Therefore, in the semiconductor device DEV3, a signal can be transmitted and received between the semiconductor chip CHP1 and the semiconductor chip CHP2 via the inductor ID1 and the inductor ID2, and a signal can be transmitted and received between the semiconductor chip CHP1 and the semiconductor chip CHP2 via the inductor ID3 and the inductor ID4. As described above, according to the semiconductor device DEV3, signal transmission and signal reception in multichannel can be performed between the semiconductor chip CHP1 and the semiconductor chip CHP2.

Incidentally, FIGS. 18 to 20 show that there are two channels for transmitting and receiving signals between the semiconductor chip CHP1 and the semiconductor chip CHP2, but if the number of inductors is increased, signals can be transmitted and received between the semiconductor chip CHP1 and the semiconductor chip CHP2 in three or more channels.

When the first distance is larger than the second distance and the third distance, interference between a channel for transmission and reception of a signal configured by the inductor ID1 and the inductor ID2 and a channel for transmission and reception of a signal configured by the inductor ID3 and the inductor ID4 is suppressed. The coupling coefficient between the inductors is proportional to the square of the dielectric distance between the inductors. Therefore, for example, if the first distance is 10 times or more than the second distance and the third distance, it is possible to reduce the interference between the channel of the transmission and reception of the signal configured by the inductor ID1 and the inductor ID2 and the channel of the transmission and reception of the signal configured by the inductor ID3 and the inductor ID4 to 1% or less.

Fourth Embodiment

A semiconductor device according to the fourth embodiment will be described. The semiconductor device according to the fourth embodiment is defined as a semiconductor device DEV4. Here, differences from the semiconductor device DEV3 will be mainly described, and redundant description will not be repeated.

Configuration of Semiconductor Device DEV4

The configuration of the semiconductor device DEV4 is described below.

Figure 21:
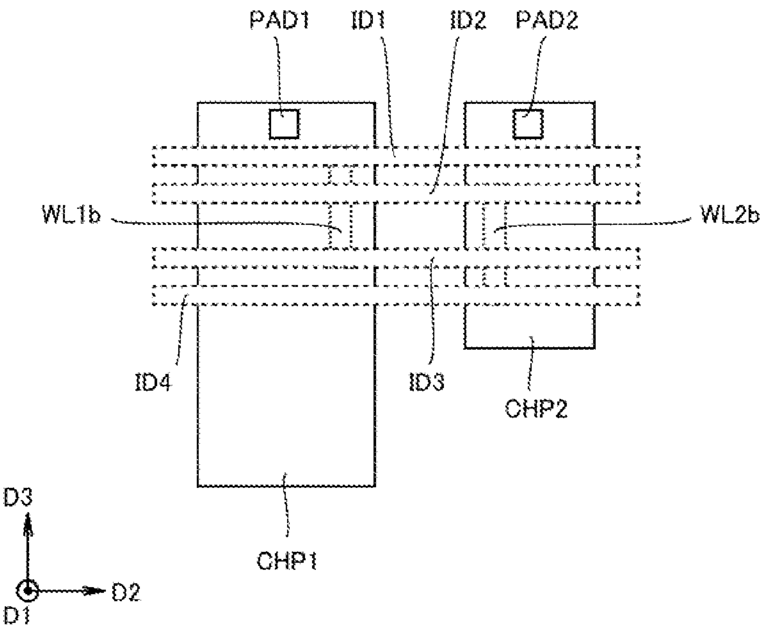
FIG. 21 is a plan view of a semiconductor device DEV4.

FIG. 21 is a plan view of the semiconductor device DEV4. In FIG. 21, the illustration of the redistribution layer FOL is omitted, the inductor ID1, the inductor ID2, the inductor ID3 and the inductor ID4 are shown by the dotted line. In FIG. 21, the wiring WL1*b* in the uppermost layer and the wiring WL2*b* in the uppermost layer are indicated by dotted lines.

As shown in FIG. 21, in the semiconductor device DEV4, the inductor ID1 and the inductor ID3 are electrically connected to each other by the wiring WL1*b* in the uppermost layer. In the semiconductor device DEV4, the inductor ID2 and the inductor ID4 are electrically connected to each other by the wiring WL2*b* in the uppermost layer. In these respects, the configuration of the semiconductor device DEV4 is different from the configuration of the semiconductor device DEV3.

Effects of Semiconductor Device DEV4

The effects of the semiconductor device DEV4 are described below.

In the semiconductor device DEV4, the inductor ID1 and the inductor ID3 are electrically connected to each other by the wiring WL1*b* in the uppermost layer, and the inductor ID2 and the inductor ID4 are electrically connected to each other by the wiring WL2*b* in the uppermost layer. Therefore, according to the semiconductor device DEV4, the differential transformer can be configured by the inductor ID1 and the inductor ID3, and the differential transformer can be configured by the inductor ID2 and the inductor ID4.

Fifth Embodiment

A semiconductor device according to the fifth embodiment will be described. The semiconductor device according to the fifth embodiment is defined as a semiconductor device DEV5. Here, differences from the semiconductor device DEV1 will be mainly described, and redundant description will not be repeated.

The configuration of the semiconductor device DEV5 will be described below.

Figure 22:
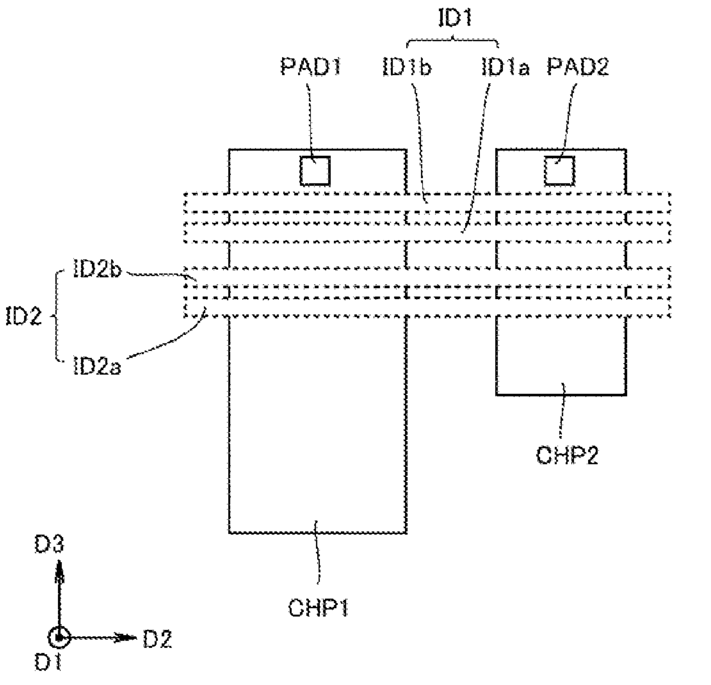
FIG. 22 is a plan view of a semiconductor device DEV5.
Figure 23:
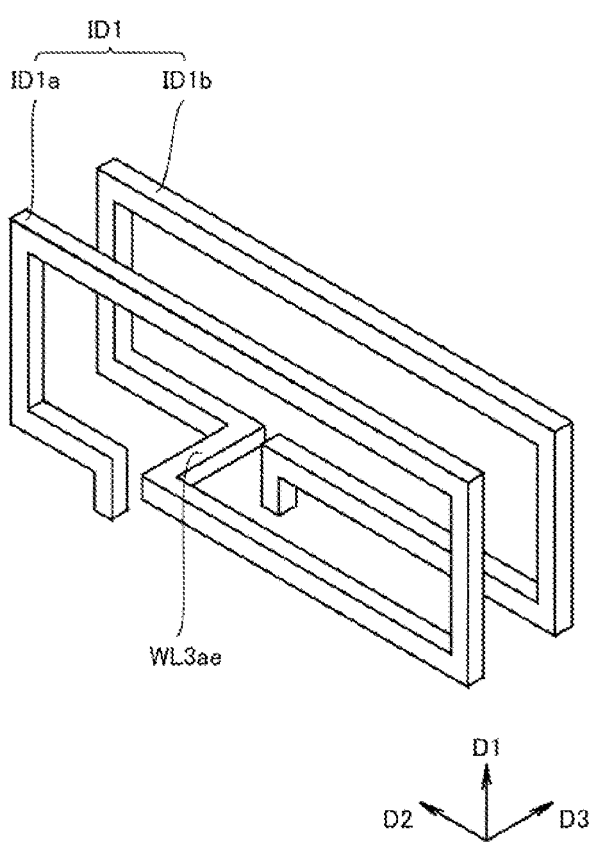
FIG. 23 is a schematic perspective view of an inductor ID1.
Figure 24:
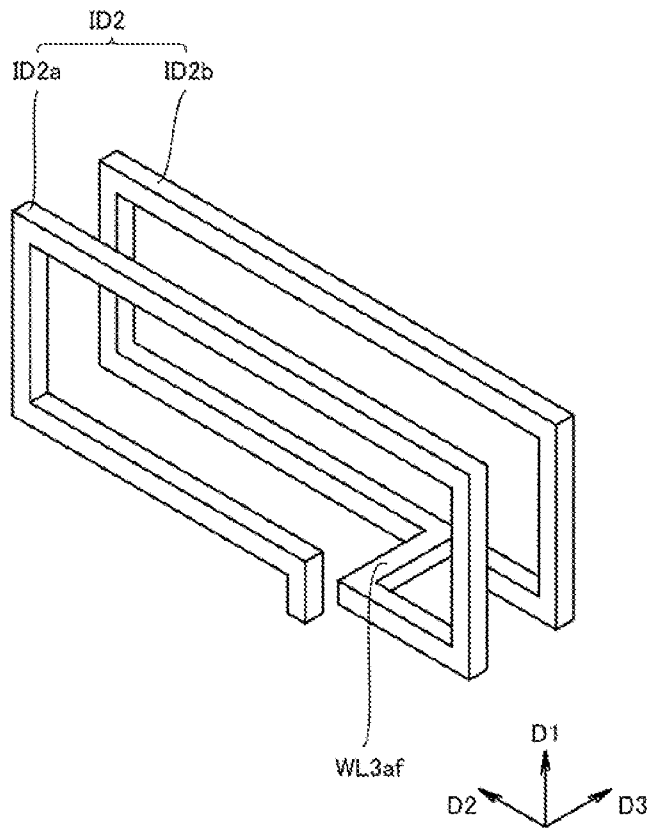
FIG. 24 is a schematic perspective view of an inductor ID2.

FIG. 22 is a plan view of the semiconductor device DEV5. In FIG. 22, the illustration of the redistribution layer FOL is omitted, and the inductor ID1 and the inductor ID2 are indicated by dotted lines. FIG. 23 is a schematic perspective view of the inductor ID1. FIG. 24 is a schematic perspective view of the inductor ID2. As shown in FIGS. 22 to 24, in the semiconductor device DEV5, the inductor ID1 includes a first portion ID1*a* and a second portion ID1*b*. In the semiconductor device DEV5, the inductor ID2 includes a first portion ID2*a* and a second portion ID2*b*.

Each of the first portion ID1*a* and the second portion ID1*b* is wound across the semiconductor chip CHP1 and the semiconductor chip CHP2 in a plane orthogonal to the third direction D3. Each of the first portion ID1*a* and the second portion ID1*b* is formed so as to overlap with the semiconductor chip CHP1 and the semiconductor chip CHP2. The first portion ID1*a* and the second portion ID1*b* are spaced apart and face each other in the third direction D3. One end of the first portion ID1*a* and the other end of the second portion ID1*b* are electrically connected to the semiconductor chip CHP1. The other end of the first portion ID1*a* and one end of the second portion ID1*b* are electrically connected to each other by the wiring WL3*a* (connecting portion WL3*ae*). The connecting portion WL3*ae* extends along the third direction D3.

Each of the first portion ID2*a* and the second portion ID2*b* is wound across the semiconductor chip CHP1 and the semiconductor chip CHP2 in a plane orthogonal to the third direction D3. Each of the first portion ID2*a* and the second portion ID2*b* is formed so as to overlap with the semiconductor chip CHP1 and the semiconductor chip CHP2. The first portion ID2*a* and the second portion ID2*b* are spaced apart and face each other in the third direction D3. One end of the first portion ID2*a* and the other end of the second portion ID2*b* are electrically connected to the semiconductor chip CHP1. The other end of the first portion ID2*a* and one end of the second portion ID2*b* are electrically connected to each other by the wiring WL3*a* (connecting portion WL3*af*). The connecting portion WL3*af* extends along the third direction D3. In these respects, the configuration of the semiconductor device DEV5 is different from the configuration of the semiconductor device DEV1.

In the examples shown in FIGS. 22 to 24, the number of windings of each of the inductor ID1 and the inductor ID2 is 2, but the number of windings of each of the inductor ID1 and the inductor ID2 may be 3 or more. Further, in the examples shown in FIGS. 22 to 24, the inductor ID1 and the inductor ID2 are each plural, but the number of windings of either one of the inductor ID1 and the inductor ID2 may not be plural.

Effects of Semiconductor Device DEV5

The effects of the semiconductor device DEV5 are described below.

In the semiconductor device DEV5, the number of windings of each of the inductor ID1 and the inductor ID2 is plural. Therefore, according to the semiconductor device DEV5, it is possible to increase the coupling coefficient of the inductor ID1 and the inductor ID2.

Although the invention made by the present inventors has been described in detail based on the embodiments, it is needless to say that the present invention is not limited to the above-described embodiments and can be variously modified without departing from the gist thereof.

What is claimed is:

1. A semiconductor device comprising:
- a first semiconductor chip;
- a second semiconductor chip; and
- a redistribution layer,
- wherein the first semiconductor chip and the second semiconductor chip are arranged spaced apart from each other in a second direction orthogonal to a first direction,
- wherein the first direction is a thickness direction of the semiconductor device,
- wherein the redistribution layer is disposed over the first semiconductor chip and the second semiconductor chip in the first direction so as to extend across the first semiconductor chip and the second semiconductor chip,
- wherein the redistribution layer includes a first inductor and a second inductor,
- wherein the first inductor and the second inductor are spaced apart and face each other in a third direction orthogonal to the first direction and the second direction,
- wherein the first inductor is electrically connected to the first semiconductor chip,
- wherein the second inductor is electrically connected to the second semiconductor chip, and
- wherein the first inductor and the second inductor are disposed over the first semiconductor chip and the second semiconductor chip and wound in a plane orthogonal to the third direction.

2. The semiconductor device according to claim 1, wherein one end part of the first inductor in the second direction is at a position shifted from one end part of the second inductor in the second direction, and wherein the other end part of the first inductor in the second direction is at a position shifted from the other end part of the second inductor in the second direction.

3. The semiconductor device according to claim 2, wherein a width of the first inductor in the second direction is different from a width of the second inductor in the second direction.

4. The semiconductor device according to claim 1, wherein the redistribution layer includes a third inductor and a fourth inductor, wherein the third inductor and the fourth inductor are spaced apart and face each other in the third direction, wherein the third inductor is electrically connected to the first semiconductor chip, wherein the fourth inductor is electrically connected to the second semiconductor chip, wherein the third inductor and the fourth inductor are wound across over the first semiconductor chip and the second semiconductor chip in the plane orthogonal to the third direction, wherein the second inductor is located between first inductor and the third inductor in the third direction, and wherein the third inductor is located between second inductor and the fourth inductor in the third direction.

5. The semiconductor device according to claim 4, wherein a first distance between the second inductor and the third inductor is larger than a second distance between the first inductor and the second inductor and a third distance between the third inductor and the fourth inductor.

6. The semiconductor device according to claim 5, wherein the first distance is 10 times or more than the second distance and the third distance.

7. The semiconductor device according to claim 4, wherein the first inductor and the third inductor are independent of each other, and wherein the second inductor and the fourth inductor are independent of each other.

8. The semiconductor device according to claim 4, wherein the first inductor and the third inductor are electrically connected to each other, and wherein the second inductor and the fourth inductor are electrically connected to each other.

9. The semiconductor device according to claim 8, wherein the first semiconductor chip includes a first wiring layer having a plurality of first wirings laminated in the first direction, wherein the second semiconductor chip includes a second wiring layer having a plurality of second wirings laminated in the first direction, wherein the redistribution layer is located over the first wiring layer and the second wiring layer, wherein the first inductor and the third inductor are electrically connected to each other by one of the plurality of first wirings closest to the redistribution layer side, and wherein the second inductor and the fourth inductor are electrically connected to each other by one of the plurality of second wirings closest to the redistribution layer side.

10. The semiconductor device according to claim 1, wherein at least one of the first inductor and the second inductor includes a plurality of parts electrically connected to each other, and wherein each of the plurality of parts is disposed over the first semiconductor chip and the second semiconductor chip and wound in the plane orthogonal to the third direction.

* * * * *